United States Patent
Ito et al.

(10) Patent No.: US 8,619,058 B2
(45) Date of Patent: Dec. 31, 2013

(54) ELECTROSTATIC CAPACITY TYPE TOUCH SENSOR FOR DETECTING A LARGE NUMBER OF TOUCH POSITIONS WITH A SMALL NUMBER OF DETECTION ELECTRODES

(75) Inventors: Hiroya Ito, Ichinomiya (JP); Takayasu Otagaki, Hashima (JP); Atsuhiro Ichikawa, Mizuho (JP); Kazuhiro Hasegawa, Ichinomiyai (JP)

(73) Assignee: On Semiconductor Trading, Ltd., Hamilton HM (BM)

( * ) Notice: Subject to any disclaimer, the term of this patent is extended or adjusted under 35 U.S.C. 154(b) by 156 days.

(21) Appl. No.: 13/175,277

(22) Filed: Jul. 1, 2011

(65) Prior Publication Data
US 2012/0001869 A1    Jan. 5, 2012

(30) Foreign Application Priority Data
Jul. 1, 2010    (JP) ................................. 2010-151093

(51) Int. Cl.
| G09G 5/00 | (2006.01) |
| G06F 3/041 | (2006.01) |
| G06F 3/045 | (2006.01) |
| G06F 3/044 | (2006.01) |
| G01R 27/00 | (2006.01) |
| G01R 27/28 | (2006.01) |
| G01R 27/26 | (2006.01) |

(52) U.S. Cl.
USPC ........ 345/174; 345/173; 345/156; 178/18.06; 178/18.01; 324/600; 324/649; 324/658; 324/660

(58) Field of Classification Search
CPC . G06F 2203/04111; G06F 3/03; G06F 3/044; G01R 27/26
USPC .................. 324/660; 345/174; 178/18.06
See application file for complete search history.

(56) References Cited

U.S. PATENT DOCUMENTS

| 3,172,023 A | * | 3/1965 | Blasingame | 361/292 |
| 4,092,579 A | * | 5/1978 | Weit | 318/662 |
| 4,103,252 A | * | 7/1978 | Bobick | 331/48 |
| 4,264,903 A | * | 4/1981 | Bigelow | 341/1 |

(Continued)

FOREIGN PATENT DOCUMENTS

JP    2005-190950    7/2005

OTHER PUBLICATIONS

Wolfram MathWorld; "Polar Coordinates;" Last update Jan. 19, 2013.*

*Primary Examiner* — Amare Mengistu
*Assistant Examiner* — Crystal A Mathews
(74) *Attorney, Agent, or Firm* — McDermott Will & Emery LLP

(57) ABSTRACT

There is offered an electrostatic capacity type touch sensor capable of detecting a large number of touch positions with high accuracy. The electrostatic capacity type touch sensor is composed of a touch panel and a signal processing circuit. The touch panel is structured to include first through fourth detection electrodes, first and second common electric potential lines, a common electric potential wiring, a common electric potential terminal and first through fourth output terminals disposed on an insulating substrate. The signal processing circuit is structured to include a clock generator, a selection circuit, a charge amplifier, an A/D converter and an arithmetic unit. The charge amplifier detects a change in capacitance induced by that a finger of an operator touches the first through fourth detection electrodes.

7 Claims, 9 Drawing Sheets

(56) References Cited

U.S. PATENT DOCUMENTS

| | | | |
|---|---|---|---|
| 4,380,040 A * | 4/1983 | Posset | 200/600 |
| 4,429,308 A * | 1/1984 | Shankle | 324/660 |
| 5,136,286 A * | 8/1992 | Veneruso | 340/870.37 |
| 5,657,012 A * | 8/1997 | Tait | 341/20 |
| 5,764,066 A * | 6/1998 | Novak et al. | 324/662 |
| 5,973,668 A * | 10/1999 | Watanabe | 345/157 |
| 6,147,856 A * | 11/2000 | Karidis | 361/277 |
| 6,288,707 B1 * | 9/2001 | Philipp | 345/168 |
| 6,346,818 B2 * | 2/2002 | Wilson et al. | 324/658 |
| 6,828,801 B1 * | 12/2004 | Burdick et al. | 324/658 |
| 7,078,633 B2 * | 7/2006 | Ihalainen | 200/6 A |
| 7,218,124 B1 * | 5/2007 | Mackey et al. | 324/660 |
| 7,288,732 B2 * | 10/2007 | Hashida | 200/5 A |
| 7,310,089 B2 * | 12/2007 | Baker et al. | 345/173 |
| 7,733,333 B2 * | 6/2010 | Kaliher | 345/173 |
| 7,786,981 B2 * | 8/2010 | Proctor | 345/173 |
| 8,217,915 B2 * | 7/2012 | Philipp | 345/174 |
| 8,416,198 B2 * | 4/2013 | Rathnam et al. | 345/173 |
| 2003/0184517 A1 * | 10/2003 | Senzui et al. | 345/156 |
| 2005/0052429 A1 * | 3/2005 | Philipp | 345/173 |
| 2005/0156881 A1 * | 7/2005 | Trent et al. | 345/157 |
| 2006/0284836 A1 * | 12/2006 | Philipp | 345/156 |
| 2007/0247421 A1 * | 10/2007 | Orsley et al. | 345/156 |
| 2007/0291016 A1 * | 12/2007 | Philipp | 345/174 |
| 2008/0018615 A1 * | 1/2008 | Zadesky et al. | 345/173 |
| 2008/0047765 A1 * | 2/2008 | Proctor | 178/18.06 |
| 2008/0158183 A1 * | 7/2008 | Hotelling et al. | 345/173 |
| 2009/0058802 A1 * | 3/2009 | Orsley | 345/157 |
| 2009/0266622 A1 * | 10/2009 | Yoshikawa | 178/18.01 |
| 2009/0273573 A1 * | 11/2009 | Hotelling | 345/173 |
| 2010/0123679 A1 * | 5/2010 | Kim et al. | 345/174 |
| 2010/0289765 A1 * | 11/2010 | Noguchi et al. | 345/173 |
| 2010/0315363 A1 * | 12/2010 | Kobayashi et al. | 345/173 |
| 2011/0074728 A1 * | 3/2011 | Liu | 345/174 |
| 2011/0169667 A1 * | 7/2011 | Rothkopf et al. | 341/20 |
| 2011/0199331 A1 * | 8/2011 | Otagaki et al. | 345/174 |
| 2011/0248934 A1 * | 10/2011 | Yeh et al. | 345/173 |
| 2012/0062464 A1 * | 3/2012 | Otagaki et al. | 345/168 |
| 2012/0160657 A1 * | 6/2012 | Mizushima | 200/600 |
| 2012/0327026 A1 * | 12/2012 | Lee et al. | 345/174 |

* cited by examiner $$X = \left(R + W \times \frac{n}{90}\right) \times \cos\left(\pi \times \frac{n}{180}\right)$$

$$Y = \left(R + W \times \frac{n}{90}\right) \times \sin\left(\pi \times \frac{n}{180}\right)$$

CHARGE ACCUMULATION MODE

CHARGE TRANSFER MODE

ELECTROSTATIC CAPACITY TYPE TOUCH SENSOR FOR DETECTING A LARGE NUMBER OF TOUCH POSITIONS WITH A SMALL NUMBER OF DETECTION ELECTRODES

CROSS-REFERENCE OF THE INVENTION

This application claims priority from Japanese Patent Application No. 2010-151093, the content of which is incorporated herein by reference in its entirety.

BACKGROUND OF THE INVENTION

1. Field of the Invention

This invention relates to an electrostatic capacity type touch sensor.

2. Description of the Related Art

The electrostatic capacity type touch sensor has been known as an input device to various kinds of equipment. A conventional electrostatic capacity type touch sensor is provided with a touch panel having a display panel that shows an input content to be data-inputted and a detection unit to detect that the input content shown on the display panel is designated by an operator. The detection unit recognizes the input content designated by the operator by detecting a change in electrostatic capacitance induced by that a finger of the operator approaches a detection electrode formed on an insulative circuit board.

Technologies mentioned above are disclosed in Japanese Patent Application Publication No. 2005-190950, for example.

With the conventional electrostatic capacity type touch sensor, however, there is a limit for detecting a large number of touch positions on the touch panel, that is, for increasing a quantity of data input.

This invention is directed to offering an electrostatic capacity type touch sensor capable of detecting a large number of touch positions using a small number of detection electrodes.

This invention is also directed to offering an electrostatic capacity type touch sensor improved in linearity of correlation between an output of the sensor and the touch position, as well as in detection accuracy of the touch position.

SUMMARY OF THE INVENTION

This invention provides an electrostatic capacity type touch sensor having a substrate, a first common electric potential line disposed on the substrate, a second common electric potential line disposed on the substrate so as to surround the first common electric potential line, first and second detection electrodes disposed in a region interposed between the first and second common electric potential lines and being axisymmetrical with respect to a Y axis that intersects a common center of the first and second common electric potential lines, third and fourth detection electrodes disposed in the region and being axisymmetrical with respect to an X axis that intersects the common center and is orthogonal to the Y axis, and a charge amplifier generating a first output voltage that is proportional to a capacitance difference between a capacitance of a first capacitor formed between the first detection electrode and the first and second common electric potential lines and a capacitance of a second capacitor formed between the second detection electrode and the first and second common electric potential lines and a second output voltage that is proportional to a capacitance difference between a capacitance of a third capacitor formed between the third detection electrode and the first and second common electric potential lines and a capacitance of a fourth capacitor formed between the fourth detection electrode and the first and second common electric potential lines.

DETAILED DESCRIPTION OF THE INVENTION

First Embodiment

Figure 1:
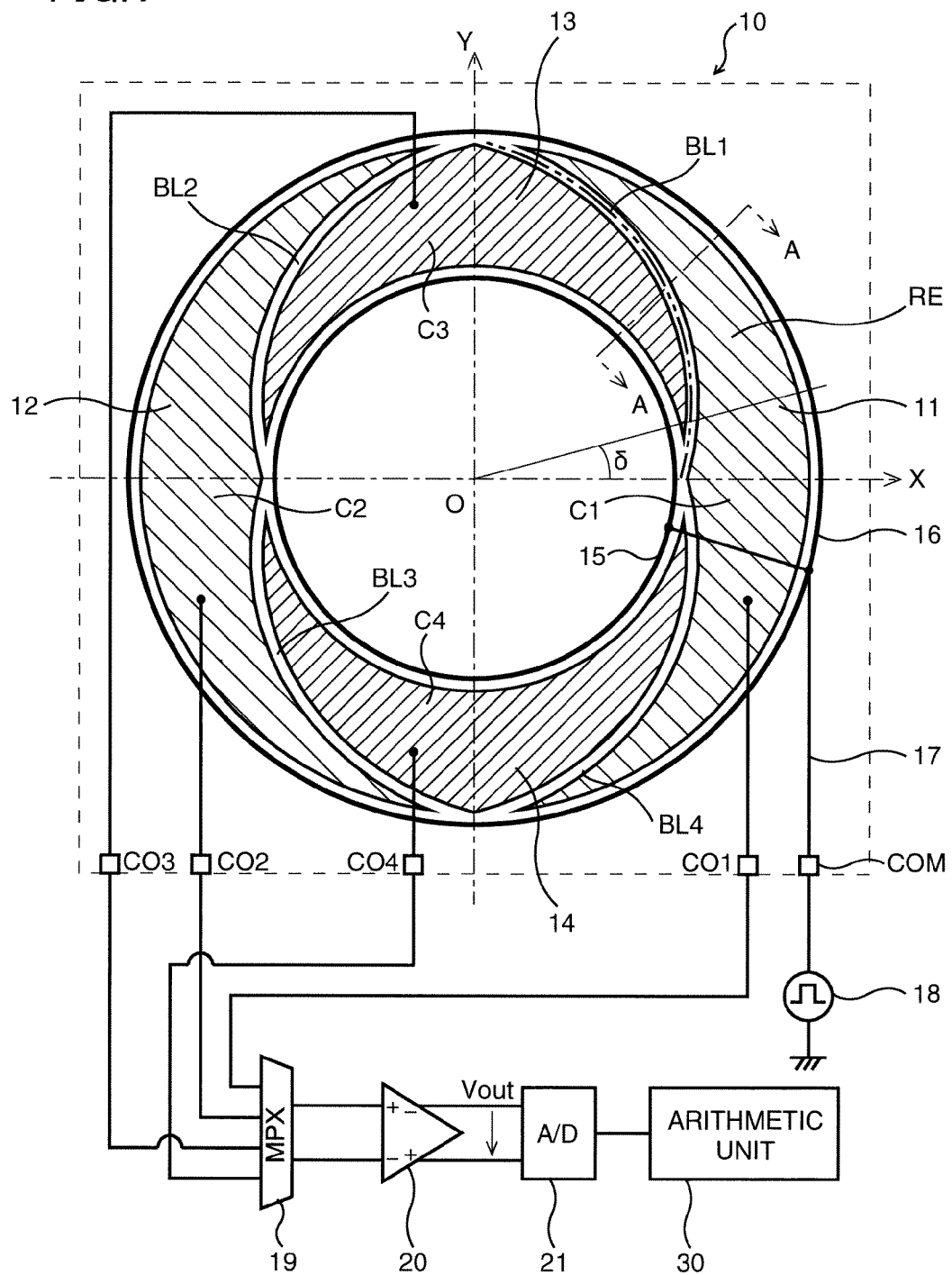
FIG. 1 shows a structure of an electrostatic capacity type touch sensor according to a first embodiment of this invention.
Figure 2:
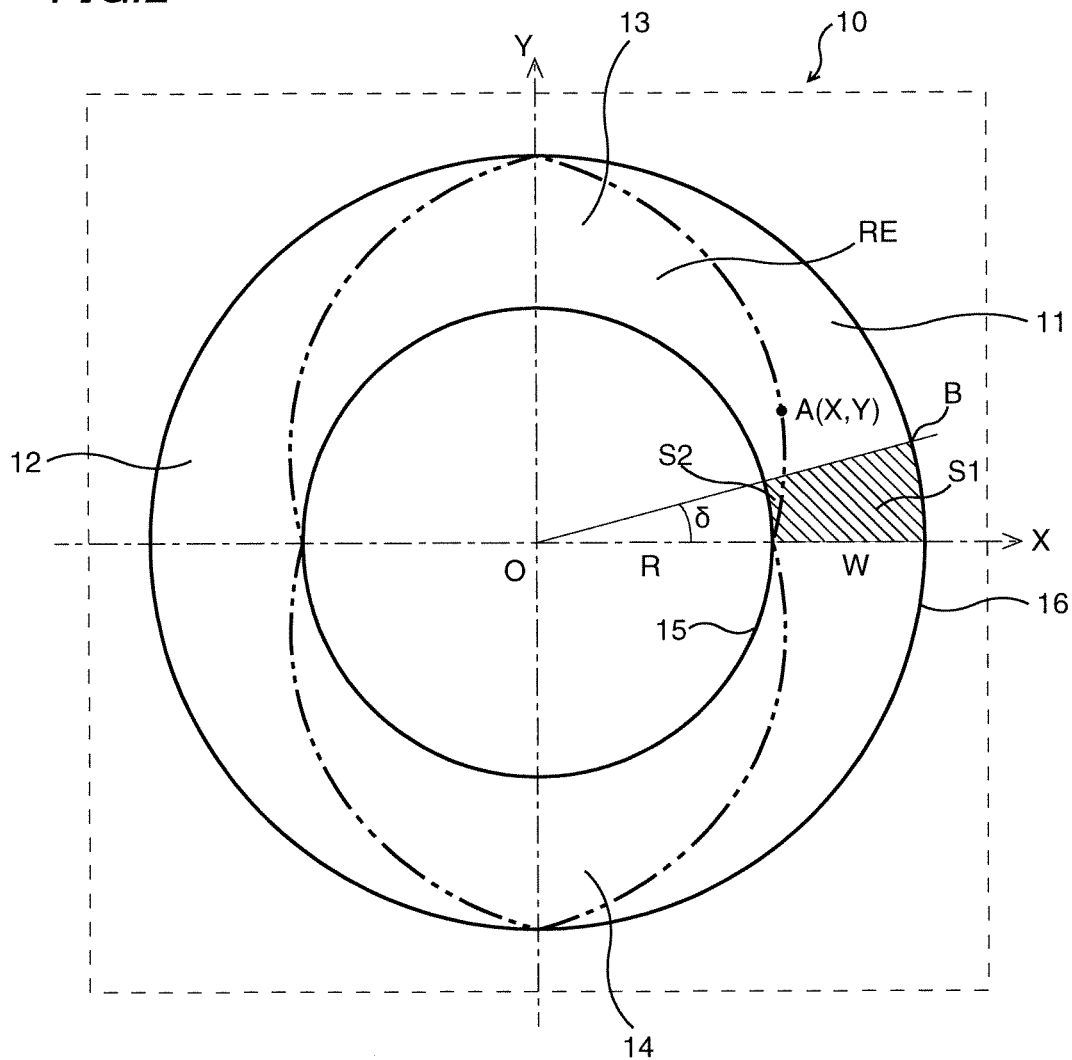
FIG. 2 shows a structure of a touch panel in the electrostatic capacity type touch sensor shown in FIG. 1.
Figure 3:
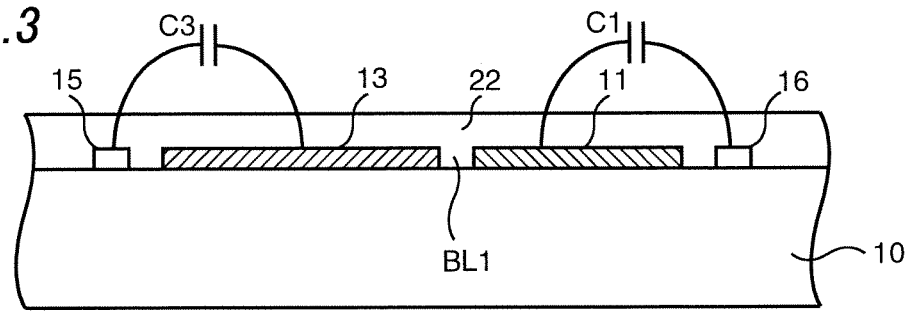
FIG. 3 is a cross-sectional view showing a section A-A in FIG. 1.

FIG. 1 shows a structure of an electrostatic capacity type touch sensor according to a first embodiment of this invention. FIG. 2 shows a structure of a touch panel in the electrostatic capacity type touch sensor shown in FIG. 1. FIG. 3 is a cross-sectional view showing a section A-A in FIG. 1.

The electrostatic capacity type touch sensor is composed of a touch panel and a signal processing circuit. The touch panel is structured to include an insulating substrate 10 such as a PCB substrate, and first through fourth detection electrodes 11, 12, 13 and 14, first and second common electric potential lines 15 and 16, a common electric potential wiring 17, a common electric potential terminal COM and first through fourth output terminals CO1, CO2, CO3 and CO4 disposed on the insulating substrate 10.

The signal processing circuit is structured to include a clock generator 18, a selection circuit 19, a charge amplifier 20, an A/D converter 21 and an arithmetic unit 30.

The first common electric potential line 15 is disposed on a circumference of a circle having a radius R and a center point located at a center O. The second common electric potential line 16 is disposed on a circumference of a circle having a radius (R+W) and a center point located at the center O. That is, the first common electric potential line 15 and the second common electric potential line 16 are disposed on the circumferences of the two concentric circles, respectively. In this case, it is preferable that R is 12.5 mm, W is 5 mm and a width of each of the first and second common electric potential lines 15 and 16 is about 0.5 mm, for example.

The first common electric potential line 15 is electrically connected with the second common electric potential line 16 through the common electric potential wiring 17. The common electric potential wiring 17 is made of an upper wiring layer or a lower wiring layer that is different from a wiring layer forming the first through fourth output terminals CO1-CO4, and is electrically isolated from the first through fourth output terminals CO1-CO4. The common electric potential wiring 17 is connected to the common electric potential terminal COM. A clock alternating between an H level and an L level is applied from the clock generator 18 to the common electric potential terminal COM. As a result, the clock is applied to the first and second common electric potential lines 15 and 16.

The first through fourth detection electrodes 11-14 are disposed in a ring region RE having a width W and interposed between the first and second common electric potential lines 15 and 16. The first and second detection electrodes 11 and 12 are shaped and disposed axisymmetrical with respect to a Y axis that intersects the center O. The third and fourth detection electrodes 13 and 14 are shaped and disposed axisymmetrical with respect to an X axis that intersects the center O. The X axis and the Y axis intersect orthogonally.

In other words, the first and second detection electrodes 11 and 12 are shaped and disposed point-symmetrical with respect to the center O, while the third and fourth detection electrodes 13 and 14 are shaped and disposed point-symmetrical with respect to the center O. The first and second detection electrodes 11 and 12 are shaped in a pair of crescents congruent with each other, while the third and fourth detection electrodes 13 and 14 are shaped in a pair of crescents congruent with each other. A width of each of the first and second detection electrodes 11 and 12 takes a maximum value at Y=0, while a width of each of the third and fourth detection electrodes 13 and 14 takes a maximum value at X=0. The maximum value is about 4 mm, for example.

A right edge of the first detection electrode 11 faces a right half of the second common electric potential line 16 with a short separation (about 0.5 mm), while a left edge of the second detection electrode 12 faces a left half of the second common electric potential line 16 with a short separation (about 0.5 mm). A lower edge of the third detection electrode 13 faces an upper half of the first common electric potential line 15 with a short separation (about 0.5 mm), while an upper edge of the fourth detection electrode 14 faces a lower half of the first common electric potential line 15 with a short separation (about 0.5 mm).

The first detection electrode 11 and the third detection electrode 13 are separated from each other by a narrow boundary region BL1 in a first quadrant of an X-Y coordinate system defined by the X axis and the Y axis. The cross-sectional view of the section A-A in FIG. 3 shows that an insulating film 22 covers the first detection electrode 11, the third detection electrode 13 and the first and second common electric potential lines 15 and 16, which are disposed on the insulating substrate 10.

The second detection electrode 12 and the third detection electrode 13 are separated from each other by a narrow boundary region BL2 in a second quadrant of the X-Y coordinate system. Similarly, the second detection electrode 12 and the fourth detection electrode 14 are separated from each other by a narrow boundary region BL3 in a third quadrant of the X-Y coordinate system. Similarly, the first detection electrode 11 and the fourth detection electrode 14 are separated from each other by a narrow boundary region BL4 in a fourth quadrant of the X-Y coordinate system. The boundary regions BL1 and BL2 are axisymmetrical with respect to the Y axis, while the boundary regions BL3 and BL4 are axisymmetrical with respect to the Y axis. A width of each of the boundary regions BL1-BL4 is about 0.5 mm.

The first and second common electric potential lines 15 and 16, and the first through fourth detection electrodes 11-14 can be formed using transparent conductive material such as ITO (Indium Tin Oxide) or metal such as aluminum.

Focusing on the boundary region BL1 between the first detection electrode 11 and the third detection electrode 13 in the first quadrant, coordinates (X, Y) of a point A on a center line (indicated by a chain double-dashed line in FIG. 1 and in FIG. 2) of the boundary region BL1 are represented by following equations.

$$X=(R+W\times n/90°)\times\cos(\pi\times n/180°) \quad (1)$$

$$Y=(R+W\times n/90°)\times\sin(\pi\times n/180°) \quad (2)$$

Here, n is 0°-90°. When n=0°, there is derived (X, Y)=(R, 0), that is, the point A is located on the circumference of the circle representing the first common electric potential line 15. When n=90°, there is derived (X, Y)=(0, R+W), that is, the point A is located on the circumference of the circle representing the second common electric potential line 16.

There is considered a sector form with a center angle δ (10°, for example) regarding the circle representing the second common electric potential line 16, as shown in FIG. 2. An overlapping region (shaded region in FIG. 2) between the sector form and the ring region RE interposed between the first and second common electric potential lines 15 and 16 can be considered as a touch region to which the finger of the operator touches.

An area of the first detection electrode 11 included in the touch region is denoted as S1, and an area of the third detection electrode 13 included in the touch region is denoted as S2. Suppose the sector form rotates counterclockwise around the center O in the first quadrant of the X-Y coordinate system. It corresponds to that a touch position of the finger of the operator to the touch panel rotates counterclockwise in the ring region RE. A state shown in FIG. 2 corresponds to the case in which a rotation angle of the sector form is 0°. When the rotation angle reaches 80° as it increases from 0°, an edge B of the sector form reaches the Y axis.

Figure 4:
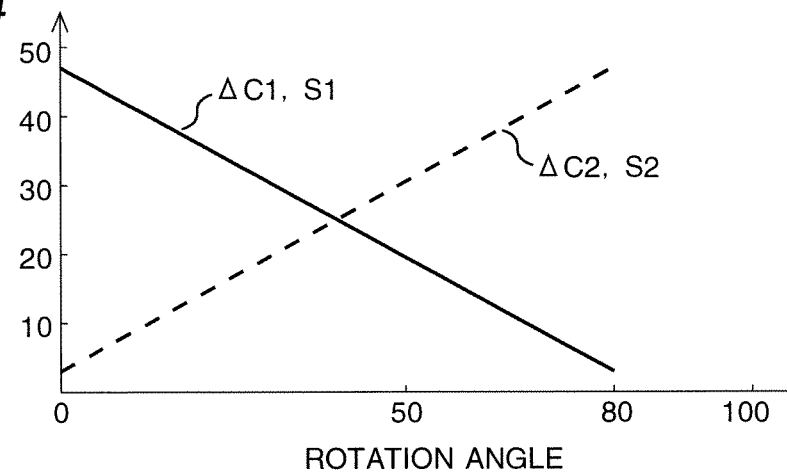
FIG. 4 shows a correlation between each of capacitance changes $\Delta C1$ and $\Delta C2$ of detection electrodes and a rotation angle of a sector form.

FIG. 4 shows a correlation between a change in each of the areas S1 and S2 and the rotation angle of the sector form (center angle δ=10'). That is, as the rotation angle increases, the area S1 decreases linearly and the area S2 increases linearly. S1+S2 remains constant. A scale of a vertical axis in FIG. 4 is a relative scale, and is set so that S1+S2=50.

When looked from the viewpoint of capacitances and their changes, a first capacitor C1 is formed between the first detection electrode 11 and the first and second common electric potential lines 15 and 16, while a second capacitor C2 is formed between the second detection electrode 12 and the first and second common electric potential lines 15 and 16. When the finger of the operator is far away from the touch panel, a capacitance of the first capacitor C1 is equal to a capacitance of the second capacitor C2. When the finger of the operator touches the ring region RE, the capacitance of the first capacitor C1 increases in proportion to the area S1. That is because the number of electric lines of force between the first detection electrode 11 and the first and second common electric potential lines 15 and 16 increases by the number of electric lines of force passing through the finger of the operator when a dielectric model in which the finger of the operator is regarded as a dielectric material is applied. Therefore, a capacitance difference ΔC1 between the capacitance of the first capacitor C1 and the capacitance of the second capacitor C2 varies in proportion to the area S1. However, in the case where an electric field shielding model in which the finger of the operator is grounded and works to shield the electric field is applied, the capacitance of the first capacitor C1 decreases in proportion to the area S1. Following explanations are based on the dielectric model.

Similarly, a third capacitor C3 is formed between the third detection electrode 13 and the first and second common electric potential lines 15 and 16, while a fourth capacitor C4 is formed between the fourth detection electrode 14 and the first and second common electric potential lines 15 and 16. When the finger of the operator is far away from the touch panel, a capacitance of the third capacitor C3 is equal to a capacitance of the fourth capacitor C4. When the finger of the operator touches the ring region RE, the capacitance of the third capacitor C3 increases in proportion to the area S2. Therefore, a capacitance difference $\Delta C2$ between the capacitance of the third capacitor C3 and the capacitance of the fourth capacitor C4 varies in proportion to the area S2.

Thus, as the rotation angle of the sector form increases, the capacitance difference $\Delta C1$ decreases linearly and the capacitance difference $\Delta C2$ increases linearly against the increase in the rotation angle of the sector form, as shown in FIG. 4.

Figure 5:
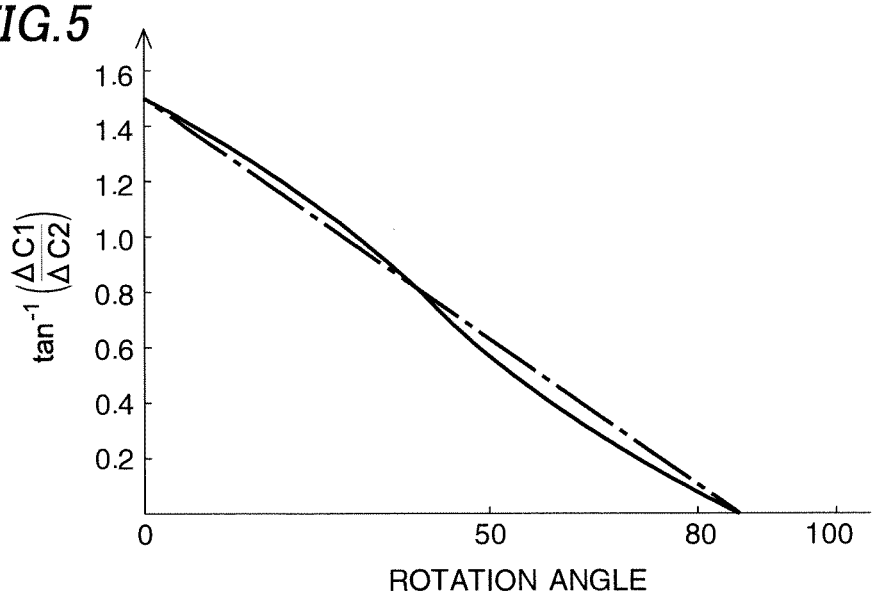
FIG. 5 shows a correlation between $\tan^{-1}(\Delta C1/\Delta C2)$ and the rotation angle of the sector form.

FIG. 5 is derived from calculation of the angle based on an equation A TAN 2 $(\Delta C1, \Delta C2) = \tan^{-1}(\Delta C1/\Delta C2)$. Here, $\tan^{-1}$ is an inverse function of tan. A horizontal axis in FIG. 5 represents the rotation angle of the sector form. A vertical axis in FIG. 5 represents $\tan^{-1}(\Delta C1/\Delta C2)$, and its unit is radian. A curve in FIG. 5 representing a correlation between $\tan^{-1}(\Delta C1/\Delta C2)$ and the rotation angle is substantially a straight line with a deviation from an ideal linear correlation (indicated by a chain line in FIG. 5) being less than 1%. Therefore, the rotation angle of the sector form, that is, the touch position of the finger of the operator can be determined with high accuracy from the capacitance differences $\Delta C1$ and $\Delta C2$ electrically obtained by the signal processing circuit and through the calculation based on the equation described above.

A structure of the signal processing circuit is hereafter explained in detail. Each of the first through fourth detection electrodes 11-14 is connected to each of the first through fourth output terminals CO1-CO4 disposed on the insulating substrate 10, respectively. Each of the first through fourth output terminals CO1-CO4 is connected to corresponding each of input terminals of the selection circuit 19. The selection circuit 19 selects the first and second output terminals CO1 and CO2 in a first phase, and selects the third and fourth output terminals CO3 and CO4 in a second phase.

Each of the first and second output terminals CO1 and CO2 selected in the first phase is respectively connected to a non-inverting input terminal (+) and an inverting input terminal (−) of the charge amplifier 20. Each of the third and fourth output terminals CO3 and CO4 selected in the second phase is respectively connected to the non-inverting input terminal (+) and the inverting input terminal (−) of the charge amplifier 20.

The charge amplifier 20 is structured so as to output in the first phase a first output voltage V1 (Vout=V1) that is proportional to the capacitance difference $\Delta C1$ between the capacitance of the first capacitor C1 and the capacitance of the second capacitor C2 and to output in the second phase a second output voltage V2 (Vout=V2) that is proportional to the capacitance difference $\Delta C2$ between the capacitance of the third capacitor C3 and the capacitance of the fourth capacitor C4. Then, following equations hold:

$$V1/V2 = \Delta C1/\Delta C2$$

$$\tan^{-1}(\Delta C1/\Delta C2) = \tan^{-1}(V1/V2)$$

The A/D converter 21 converts the first and second output voltages V1 and V2 of the charge amplifier 20 into digital signals. The arithmetic unit 30 is made of a microcomputer, for example, and calculates $\tan^{-1}(V1/V2)$ using the first and second output voltages V1 and V2 converted into the digital signals so that the rotation angle of the sector form, that is, the touch position of the finger of the operator is determined based on the correlation between $\tan^{-1}(V1/V2)$ and the rotation angle of the sector form.

In this case, a correlation curve between $\tan^{-1}(V1/V2)$ and the rotation angle is the same as the correlation curve between $\tan^{-1}(\Delta C1/\Delta C2)$ and the rotation angle, and is almost a straight line. Therefore, the rotation angle of the sector form, that is, the touch position of the finger of the operator can be accurately determined based on the calculation of $\tan^{-1}(V1/V2)$. The electrostatic capacity type touch sensor according to the first embodiment of this invention has excellent noise immunity, since it detects the change in the capacitance induced by the finger touch of the operator by a differential method. A data input device can be formed by assigning the touch position to an input content to be data-inputted.

The detection of the touch position in the first quadrant of the X-Y coordinate system is explained as described above. The same applies to the detection of the touch position in each of the second, third and fourth quadrants.

[Example Structure of Charge Amplifier]

Figure 6:
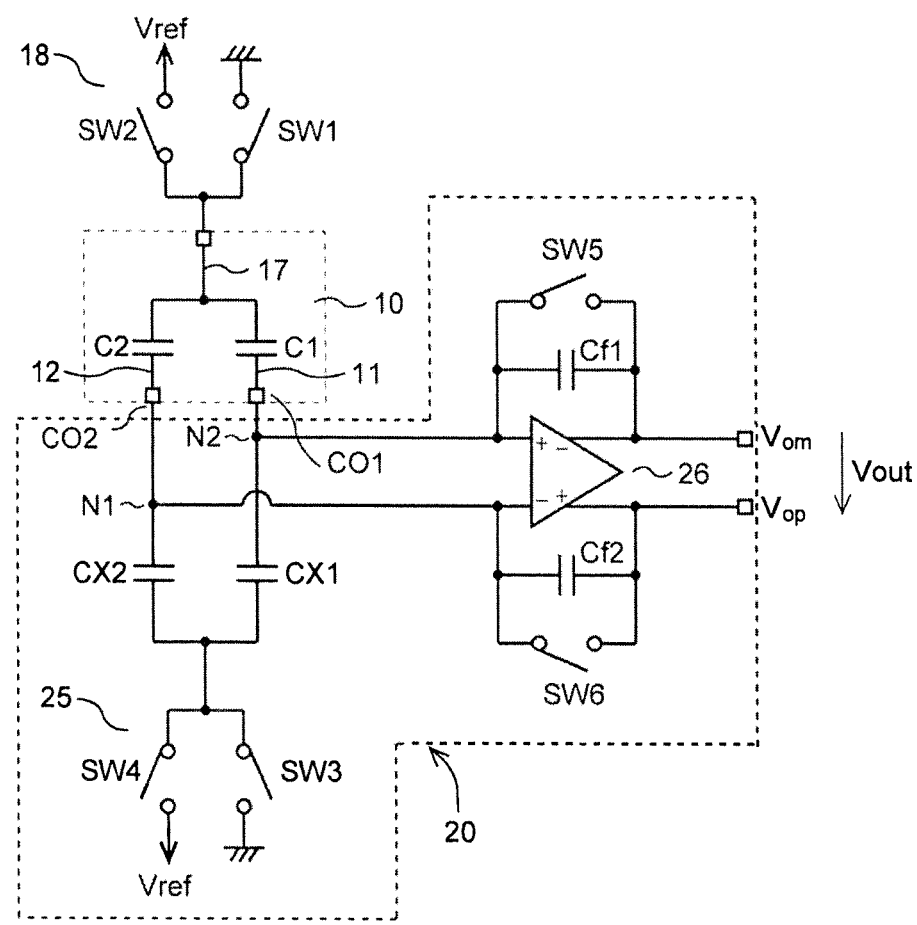
FIG. 6 is a circuit diagram of a charge amplifier.
Figure 7A:
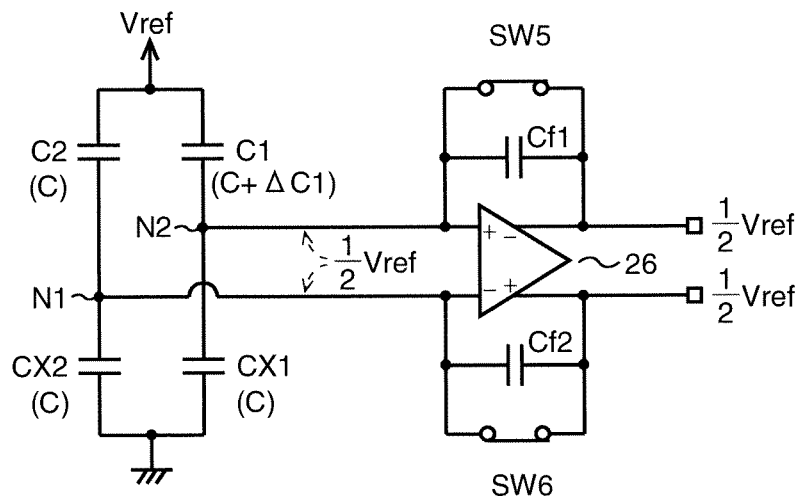
FIGS. 7A and 7B are to explain operations of the charge amplifier.
Figure 7B:
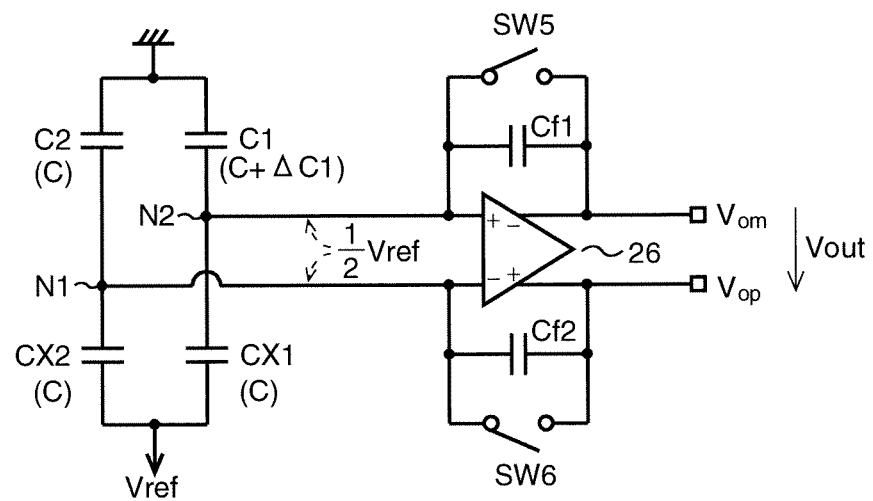

An example of a concrete structure of the charge amplifier 20 is described hereafter referring to FIGS. 6, 7A and 7B. The charge amplifier 20 is structured to include clock generators 18 and 25, capacitors CX1 and CX2, a differential amplifier 26, switches SW5 and SW6 and first and second feedback capacitors Cf1 and Cf2.

FIG. 6 shows a case in which the first and second output terminals CO1 and CO2 are selected by the selection circuit 19, a signal from the first output terminal CO1 is applied to the non-inverting input terminal (+) of the charge amplifier 20, and a signal from the second output terminal CO2 is applied to the inverting input terminal (−) of the charge amplifier 20. The first capacitor C1 and the second capacitor C2 are formed on the insulative substrate 10 that is depicted as a portion encircled by a dashed line in FIG. 6.

The clock generator 18 forms a part of the charge amplifier 20, and is composed of switches SW1 and SW2 that are turned on and off alternately. The clock generator 18 outputs a ground voltage (0 V) when the switch SW1 is turned on and the switch SW2 is turned off, and outputs a reference voltage Vref (positive voltage) when the switch SW1 is turned off and the switch SW2 is turned on. That is, the clock generator 18 outputs a clock alternating between the reference voltage Vref (H level) and 0 V (L level).

The capacitor CX1 is connected in series to the first capacitor C1, while the capacitor CX2 is connected in series to the second capacitor C2. The clock generator 25, that is similar to the clock generator 18, is connected to a connecting node between the capacitors CX1 and CX2. The clock generator 25 is composed of switches SW3 and SW4 that are turned on and off alternately. The clock generator 25 outputs the ground voltage (0 V) when the switch SW3 is turned on and the switch SW4 is turned off, and outputs the reference voltage Vref (positive voltage) when the switch SW3 is turned off and the switch SW4 is turned on. The clock generators 18 and 25 are structured so as to output the clocks that are opposite in phase to each other.

A wiring drawn out from a connecting node N2 between the first capacitor C1 and the capacitor CX1 is connected to a non-inverting input terminal (+) of the differential amplifier 26 that is an ordinary differential amplifier, while a wiring drawn out from a connecting node N1 between the second capacitor C2 and the capacitor CX2 is connected to its inverting input terminal (−).

The first feedback capacitor Cf1 is connected between an inverting output terminal (−) and the non-inverting input terminal (+) of the differential amplifier 26, while the second feedback capacitor Cf2 is connected between a non-inverting output terminal (+) and the inverting input terminal (−) of the differential amplifier 26. Each of the first and second feedback capacitors Cf1 and Cf2 has a capacitance CfA.

The switch SW5 is connected between the inverting output terminal (−) and the non-inverting input terminal (+) of the differential amplifier 26, while the switch SW6 is connected between the non-inverting output terminal (+) and the inverting input terminal (−) of the differential amplifier 26. The switches SW5 and SW6 are turned on and off simultaneously. That is, when the switches SW5 and SW6 are turned on, the inverting output terminal (−) and the non-inverting input terminal (+) of the differential amplifier 26 are short-circuited, and the non-inverting output terminal (+) and the inverting input terminal (−) of the differential amplifier 26 are short-circuited.

A voltage difference between an output voltage Vom from the inverting output terminal (−) of the differential amplifier 26 and an output voltage Vop from the non-inverting output terminal (+) of the differential amplifier 26 is represented by Vout (=Vop−Vom).

Next, operations of the charge amplifier 20 structured as described above are explained referring to FIGS. 7A and 7B. The charge amplifier 20 has a charge accumulation mode and a charge transfer mode that alternate between each other.

In the charge accumulation mode that is shown in FIG. 7A, the reference voltage Vref is applied to the first and second capacitors C1 and C2 by turning off the switch SW1 and turning on the switch SW2 of the clock generator 18. Also, the ground voltage (0 V) is applied to the capacitors CX1 and CX2 by turning off the switch SW4 and turning on the switch SW3 of the clock generator 25.

Also, the switches SW5 and SW6 are turned on. With this, the inverting output terminal (−) and the non-inverting input terminal (+) of the differential amplifier 26 are short-circuited, while the non-inverting output terminal (+) and the inverting input terminal (−) are short-circuited. As a result, a voltage at the node N1, a voltage at the node N2, a voltage at the inverting output terminal (−) and a voltage at the non-inverting output terminal (+) become ½ Vref. Here, a common mode voltage of the differential amplifier 26 is ½ Vref, which is a half of the reference voltage Vref.

Next, in the charge transfer mode that is shown in FIG. 7B, the ground voltage (0 V) is applied to the first and second capacitors C1 and C2 by turning on the switch SW1 and turning off the switch SW2 of the clock generator 18. Also, the reference voltage Vref is applied to the capacitors CX1 and CX2 by turning on the switch SW4 and turning off the switch SW3 of the clock generator 25. Also, SW5 and SW6 are turned off. After that, the operation returns to the charge accumulation mode shown in FIG. 7A, and then turns to the charge transfer mode shown in FIG. 7B again.

It is assumed that a capacitance CX1A of the capacitor CX1 is equal to a capacitance CX2A of the capacitor CX2. That is, CX1A=CX2A. The capacitance of the first capacitor C1 is denoted as C1A, and the capacitance of the second capacitor C2 is denoted as C2A. Each of the capacitances C1A and C2A in an initial state in which the finger of the operator is far away from the touch panel is denoted as C. The capacitance difference $\Delta C1$ represents a difference between the capacitance C1A of the first capacitor C1 and the capacitance C2A of the second capacitor C2 in the case where the finger of the operator touches the first detection electrode 11. That is, C1A−C2A=$\Delta C1$. Then, following equations hold.

$$C1A = C + \Delta C1$$

$$C2A = C$$

Now, the law of conservation of electric charge is applied regarding the node N2.

Equation (3) shown below holds in the charge accumulation mode.

$$\text{Electric Charges at } N2 = (C+\Delta C1) \times (-\tfrac{1}{2}V\text{ref}) + C \times (\tfrac{1}{2}V\text{ref}) \tag{3}$$

Here, $(C+\Delta C1) \times (-\tfrac{1}{2}V\text{ref})$ represents an amount of electric charges stored in the first capacitor C1, and $C \times (\tfrac{1}{2}V\text{ref})$ represents an amount of electric charges stored in the capacitor CX1.

Equation (4) shown below holds in the charge transfer mode:

$$\text{Electric Charges at } N2 = (C+\Delta C1) \times (\tfrac{1}{2}V\text{ref}) + C \times (-\tfrac{1}{2}V\text{ref}) + CfA \times (Vom - \tfrac{1}{2}V\text{ref}) \tag{4}$$

Here, $(C+\Delta C1) \times (\tfrac{1}{2}V\text{ref})$ represents an amount of electric charges stored in the first capacitor C1, $C \times (-\tfrac{1}{2}V\text{ref})$ represents an amount of electric charges stored in the capacitor CX1 and $CfA \times (Vom - \tfrac{1}{2}V\text{ref})$ represents an amount of electric charges stored in the first feedback capacitor Cf1.

Since the amount of electric charges at the node N2 in the charge accumulation mode is equal to that in the charge transfer mode, Equation (3)=Equation (4) holds.

Following equation is derived by solving Equation (3)=Equation (4) for Vom:

$$Vom = \tfrac{1}{2}V\text{ref} \times (1 - 2\Delta C1/CfA) \tag{5}$$

Similarly, the law of conservation of electric charge is applied regarding the node N1.

Equation (6) shown below holds in the charge accumulation mode.

$$\text{Electric Charges at } N1 = C \times (-\tfrac{1}{2}V\text{ref}) + C \times (\tfrac{1}{2}V\text{ref}) = 0 \tag{6}$$

Equation (7) shown below holds in the charge transfer mode.

$$\text{Electric Charges at } N1 = C \times (\tfrac{1}{2}V\text{ref}) + C \times (-\tfrac{1}{2}V\text{ref}) + CfA \times (Vop - \tfrac{1}{2}V\text{ref}) \tag{7}$$

Since the amount of electric charges at the node N1 in the charge accumulation mode is equal to that in the charge transfer mode, Equation (6)=Equation (7) holds.

Following equation is derived by solving Equation (6)=Equation (7) for Vop:

$$Vop = \tfrac{1}{2}V\text{ref} \tag{8}$$

Following equation is derived from equations (5) and (8):

$$Vout = Vop - Vom = V\text{ref} \times \Delta C1 / CfA \tag{9}$$

It is understood that the output voltage Vout (=V1) of the charge amplifier 20 varies in proportion to the capacitance difference $\Delta C1$ between the capacitances of the first and second capacitors C1 and C2.

The case in which the first and second output terminals CO1 and CO2 are selected by the selection circuit 19 is explained above. Similar explanation applies to the case in which the third and fourth output terminals CO3 and CO4 are selected by the selection circuit 19, and a signal from the third output terminal CO3 is applied to the no-inversion input terminal (+) of the charge amplifier 20 and the signal from the fourth output terminal CO4 is applied to the inverting input terminal (−) of the charge amplifier 20. That is, the output voltage Vout (=V2) of the charge amplifier 20 varies in proportion to the capacitance difference ΔC2 between the capacitances of the third and fourth capacitors C3 and C4 in this case.

Second Embodiment

Figure 8:
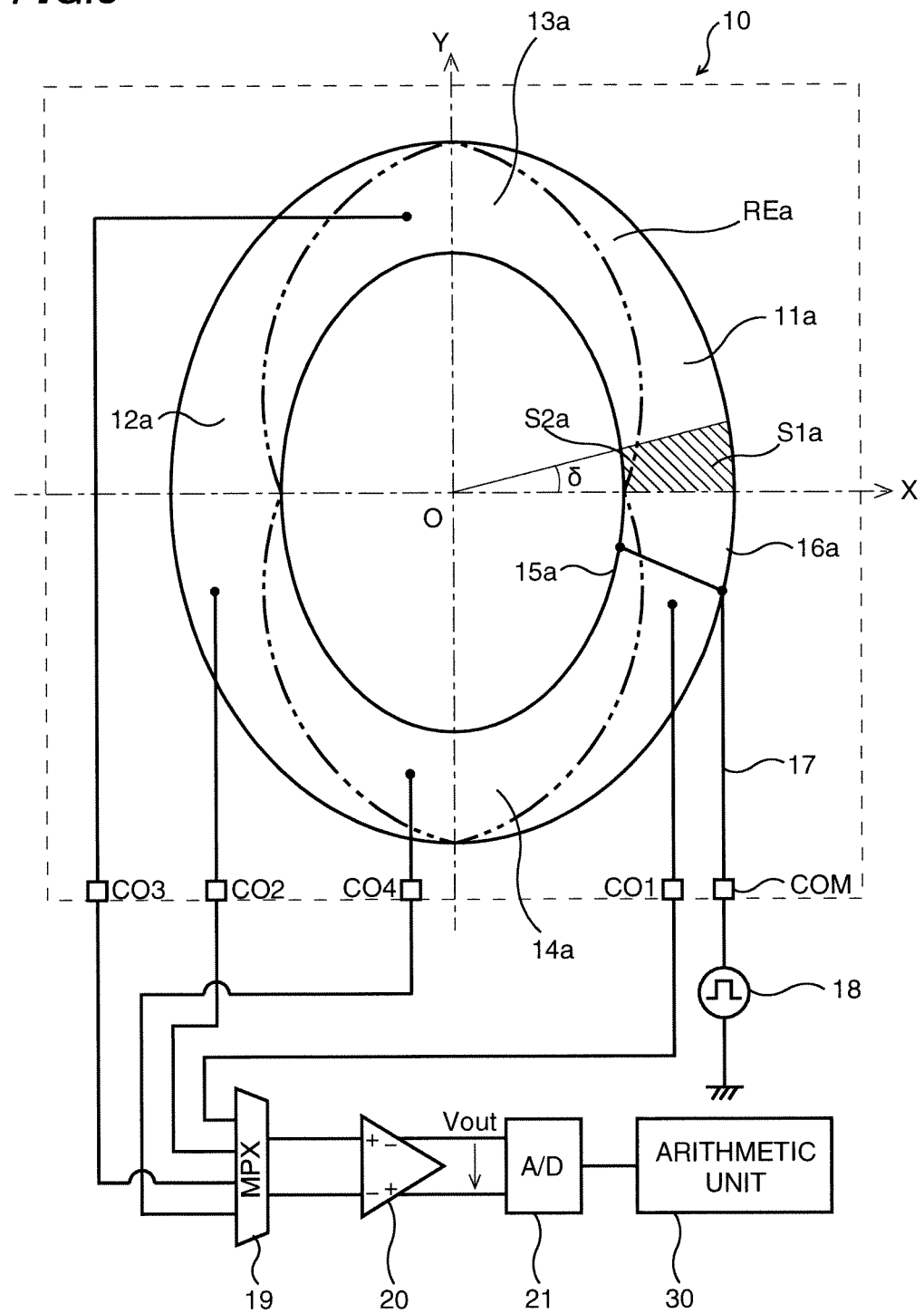
FIG. 8 shows a structure of an electrostatic capacity type touch sensor according to a second embodiment of this invention.

FIG. 8 shows a structure of an electrostatic capacity type touch sensor according to a second embodiment of this invention. Difference from the electrostatic capacity type touch sensor according to the first embodiment is in the structure of the touch panel. That is, a first common electric potential line 15a is disposed on a circumference of a first ellipse having a center O. A second common electric potential line 16a is disposed on a circumference of a second ellipse that shares the center O with the first ellipse. The second ellipse is larger than the first ellipse.

First through fourth detection electrodes 11a-14a are disposed in a ring region REa interposed between the first and second common electric potential lines 15a and 16a. The first and second detection electrodes 11a and 12a are shaped and disposed axisymmetrical with respect to a Y axis that intersects the center O. The third and fourth detection electrodes 13a and 14a are shaped and disposed axisymmetrical with respect to an X axis that intersects the center O. The X axis and the Y axis intersect orthogonally. Note that boundary regions corresponding to the boundary regions BL1-BL4 shown in FIG. 1 are omitted in FIG. 8.

There is considered a sector form with a center angle δ (10°, for example) regarding the ellipse representing the second common electric potential line 16a. An overlapping region (shaded region in FIG. 8) between the sector form and the ring region REa interposed between the first and second common electric potential lines 15a and 16a can be considered as a touch region to which the finger of the operator touches.

An area of the first detection electrode 11a included in the touch region is denoted as S1a, and an area of the third detection electrode 13a included in the touch region is denoted as S2a. Suppose the sector form rotates counterclockwise around the center O in the first quadrant of the X-Y coordinate system. It corresponds to that a touch position of the finger of the operator to the touch panel rotates counterclockwise in the ring region REa. In the second embodiment also, the area S1a deceases and the area S2a increases as the rotation angle of the sector form increases. Other structures are the same as those in the first embodiment.

The first output voltage V1 and the second output voltage V2 of the charge amplifier 20 are defined in the same way as in the first embodiment. The rotation angle of the sector form, that is, the touch position of the finger of the operator can be accurately determined based on the calculation of $\tan^{-1}$ (V1/V2) with the electrostatic capacity type touch sensor according to the second embodiment, although the linearity of the correlation curve between $\tan^{-1}$ (V1/V2) and the rotation angle is slightly poorer than that in the first embodiment.

Third Embodiment

Figure 9:
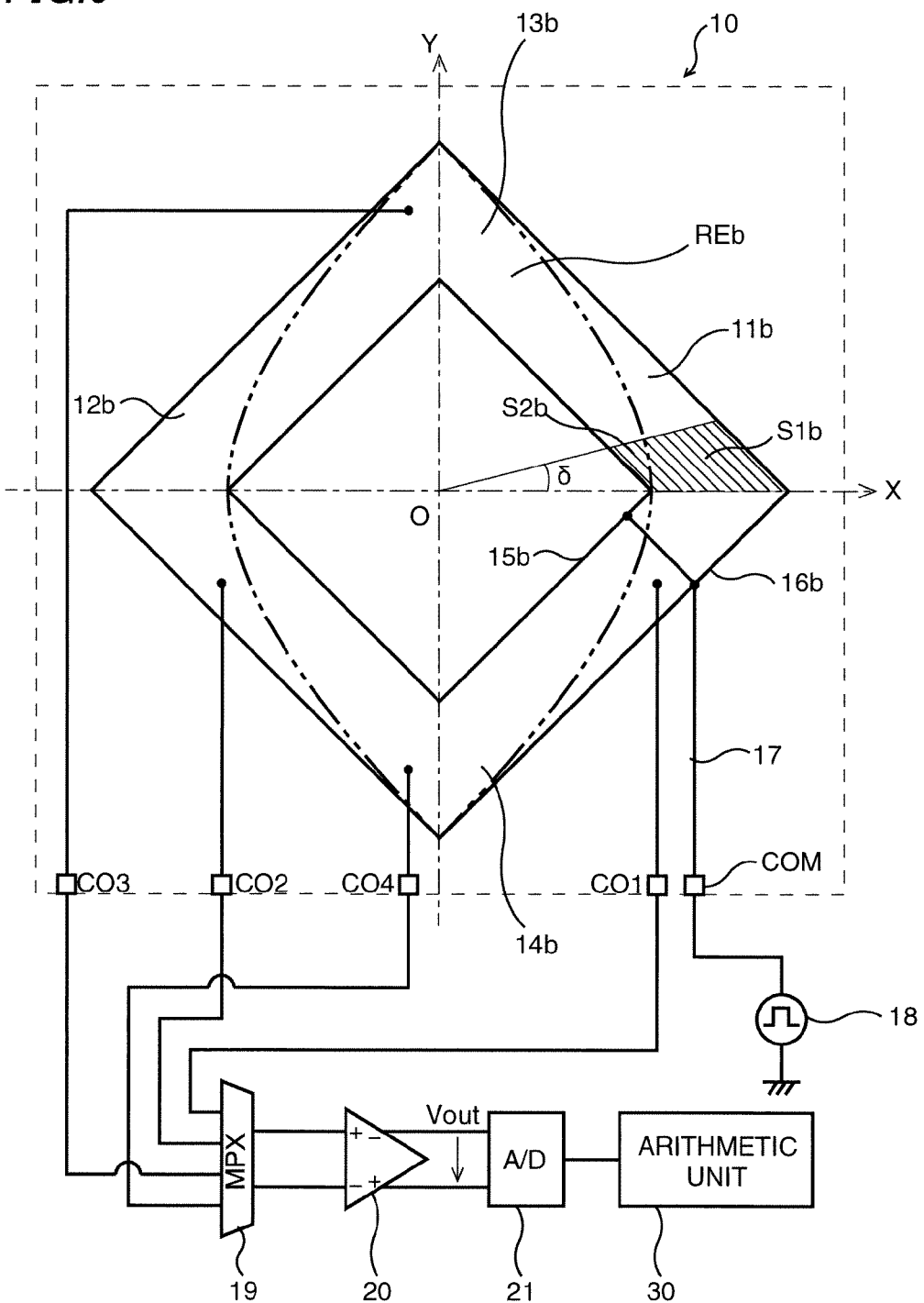
FIG. 9 shows a structure of an electrostatic capacity type touch sensor according to a third embodiment of this invention.

FIG. 9 shows a structure of an electrostatic capacity type touch sensor according to a third embodiment of this invention. Difference from the electrostatic capacity type touch sensor according to the first embodiment is in the structure of the touch panel. That is, a first common electric potential line 15b is disposed on a perimeter of a first square having a center O. A second common electric potential line 16b is disposed on a perimeter of a second square that shares the center O with the first square. The second square is larger than the first square.

First through fourth detection electrodes 11b-14b are disposed in a ring region REb interposed between the first and second common electric potential lines 15b and 16b. The first and second detection electrodes 11b and 12b are shaped and disposed axisymmetrical with respect to a Y axis that intersects the center O. The third and fourth detection electrodes 13b and 14b are shaped and disposed axisymmetrical with respect to an X axis that intersects the center O. The X axis and the Y axis intersect orthogonally. Note that boundary regions corresponding to the boundary regions BL1-BL4 shown in FIG. 1 are omitted in FIG. 9.

There is considered a sector form with a center angle δ (10°, for example) regarding the second square representing the second common electric potential line 16b. An overlapping region (shaded region in FIG. 9) between the sector form and the ring region REb interposed between the first and second common electric potential lines 15b and 16b can be considered as a touch region to which the finger of the operator touches.

An area of the first detection electrode 11b included in the touch region is denoted as S1b, and an area of the third detection electrode 13b included in the touch region is denoted as S2b. Suppose the sector form rotates counterclockwise around the center O in the first quadrant of the X-Y coordinate system. It corresponds to that a touch position of the finger of the operator to the touch panel rotates counterclockwise in the ring region REb. In the third embodiment also, the area S1b deceases and the area S2b increases as the rotation angle of the sector form increases. Other structures are the same as those in the first embodiment.

The first output voltage V1 and the second output voltage V2 of the charge amplifier 20 are defined in the same way as in the first embodiment. The rotation angle of the sector form, that is, the touch position of the finger of the operator can be accurately determined based on the calculation of $\tan^{-1}$ (V1/V2) with the electrostatic capacity type touch sensor according to the third embodiment, although the linearity of the correlation curve between $\tan^{-1}$ (V1/V2) and the rotation angle is slightly poorer than that in the first embodiment. First and second rhombuses may be used instead of the first and second squares.

Fourth Embodiment

Figure 10:
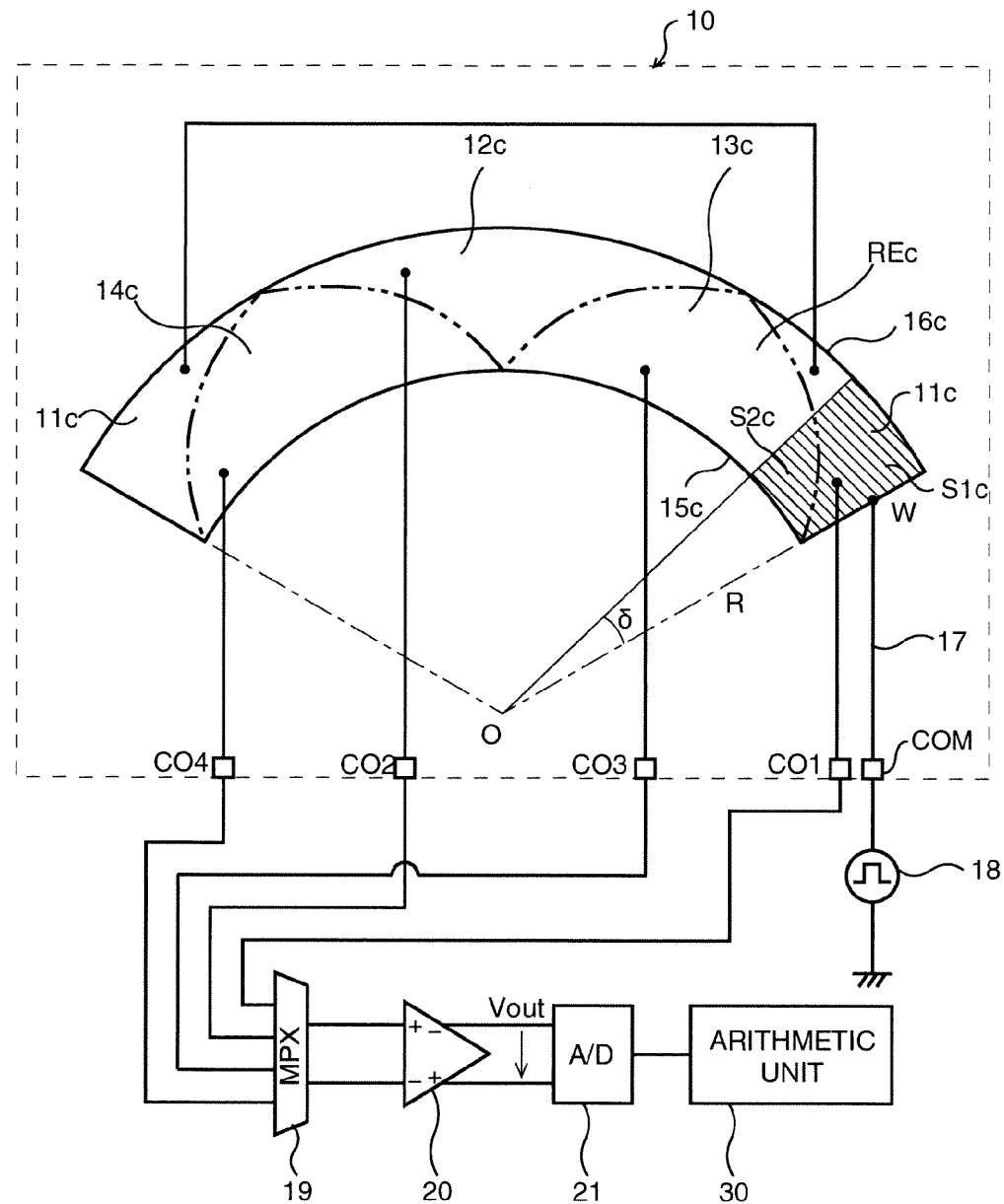
FIG. 10 shows a structure of an electrostatic capacity type touch sensor according to a fourth embodiment of this invention.

FIG. 10 shows a structure of an electrostatic capacity type touch sensor according to a fourth embodiment of this invention. Difference from the electrostatic capacity type touch sensor according to the first embodiment is in the structure of the touch panel. That is, a first common electric potential line 15c is disposed on a circumference of a first arc with a radius R having a center O. A second common electric potential line 16c is disposed on a circumference of a second arc with a radius (R+W), which shares the center O with the first arc. Both ends of the first common electric potential line 15c are respectively connected to both ends of the second common electric potential line 16c with wirings to form a closed ring region REc.

First through fourth detection electrodes 11c-14c are disposed in the ring region REc interposed between the first and second common electric potential lines 15c and 16c. Note that boundary regions corresponding to the boundary regions BL1-BL4 shown in FIG. 1 are omitted in FIG. 10.

There is considered a sector form with a center angle δ (10°, for example) regarding the second arc representing the second common electric potential line 16c. An overlapping region (shaded region in FIG. 10) between the sector form and the ring region REc interposed between the first and second common electric potential lines 15c and 16c can be considered as a touch region to which the finger of the operator touches.

An area of the first detection electrode 11e included in the touch region is denoted as S1c, and an area of the third detection electrode 13c included in the touch region is denoted as S2c. Suppose the sector form rotates counterclockwise around the center O. It corresponds to that a touch position of the finger of the operator to the touch panel rotates counterclockwise in the ring region REc. In the fourth embodiment also, the area S1c deceases and the area S2c increases as the rotation angle of the sector form increases. Other structures are the same as those in the first embodiment.

The first output voltage V1 and the second output voltage V2 of the charge amplifier 20 are defined in the same way as in the first embodiment. The rotation angle of the sector form, that is, the touch position of the finger of the operator can be accurately determined based on the calculation of $\tan^{-1}$ (V1/V2) with the electrostatic capacity type touch sensor according to the fourth embodiment, although the linearity of the correlation curve between $\tan^{-1}$ (V1/V2) and the rotation angle is slightly poorer than that in the first embodiment.

Fifth Embodiment

Figure 11:
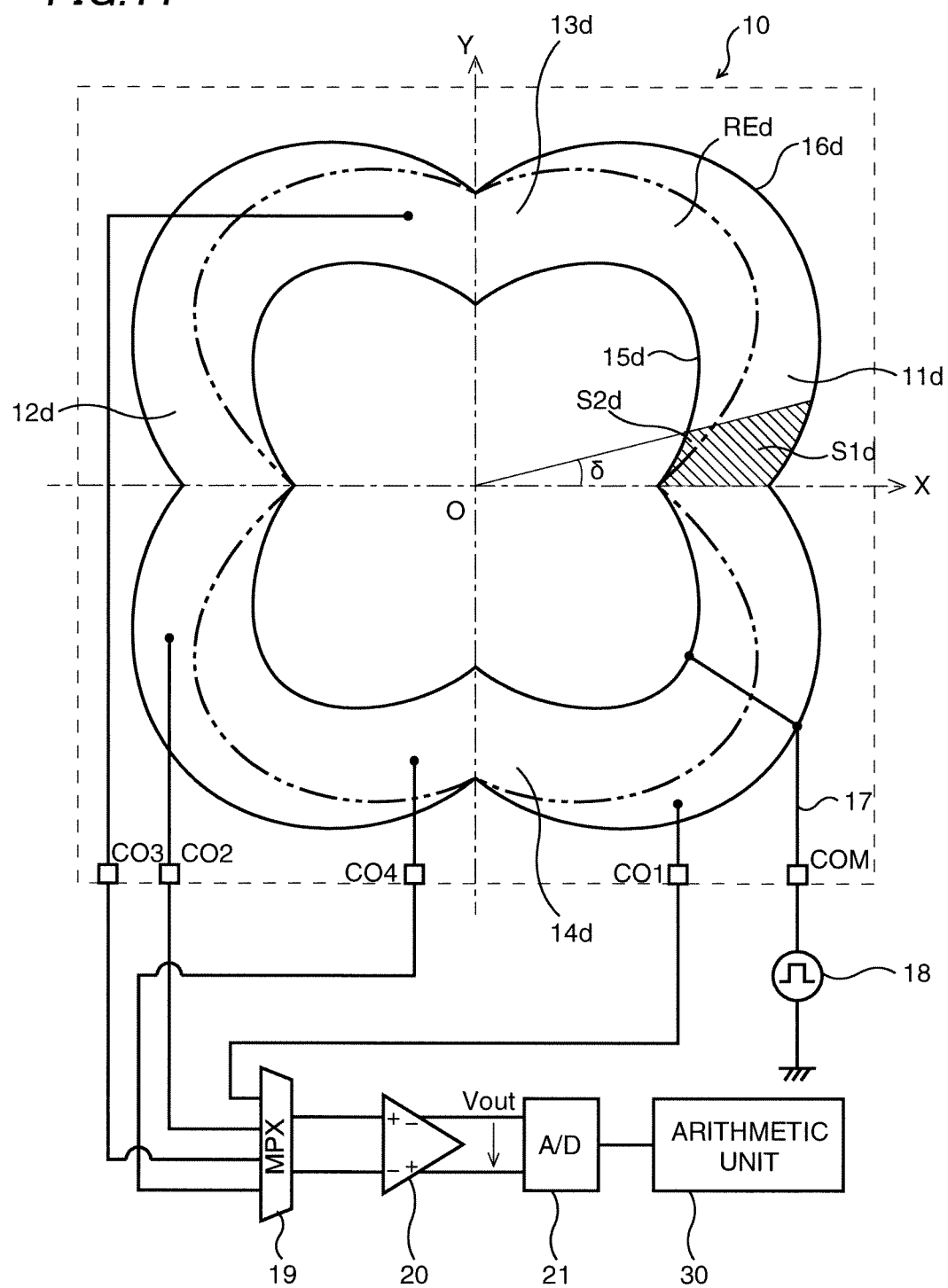
FIG. 11 shows a structure of an electrostatic capacity type touch sensor according to a fifth embodiment of this invention.

FIG. 11 shows a structure of an electrostatic capacity type touch sensor according to a fifth embodiment of this invention. Difference from the electrostatic capacity type touch sensor according to the first embodiment is in the structure of the touch panel. That is, a first common electric potential line 15d is disposed on a circumference of a first four-leaf clover shape having a center O. A second common electric potential line 16d is disposed on a circumference of a second four-leaf clover shape that shares the center O with the first four-leaf clover shape. The second four-leaf clover shape is larger than the first four-leaf clover shape.

First through fourth detection electrodes 11d-14d are disposed in the ring region REd interposed between the first and second common electric potential lines 15d and 16d. The first and second detection electrodes 11d and 12d are shaped and disposed axisymmetrical with respect to a Y axis that intersects the center O. The third and fourth detection electrodes 13d and 14d are shaped and disposed axisymmetrical with respect to an X axis that intersects the center O. The X axis and the Y axis intersect orthogonally. Note that boundary regions corresponding to the boundary regions BL1-BL4 shown in FIG. 1 are omitted in FIG. 11.

There is considered a sector form with a center angle δ (10°, for example) regarding the second four-leaf clover shape representing the second common electric potential line 16d. An overlapping region (shaded region in FIG. 11) between the sector form and the ring region REd interposed between the first and second common electric potential lines 15d and 16d can be considered as a touch region to which the finger of the operator touches.

An area of the first detection electrode 11d included in the touch region is denoted as S1d, and an area of the third detection electrode 13d included in the touch region is denoted as S2d. Suppose the sector form rotates counterclockwise around the center O in the first quadrant of the X-Y coordinate system. It corresponds to that a touch position of the finger of the operator to the touch panel rotates counterclockwise in the ring region REd. In the fifth embodiment also, the area S1d deceases and the area S2d increases as the rotation angle of the sector form increases. Other structures are the same as those in the first embodiment.

The first output voltage V1 and the second output voltage V2 of the charge amplifier 20 are defined in the same way as in the first embodiment. The rotation angle of the sector form, that is, the touch position of the finger of the operator can be accurately determined based on the calculation of $\tan^{-1}$ (V1/V2) with the electrostatic capacity type touch sensor according to the fifth embodiment, although the linearity of the correlation curve between $\tan^{-1}$ (V1/V2) and the rotation angle is slightly poorer than that in the first embodiment.

This invention provides the electrostatic capacity type touch sensor capable of detecting a large number of touch positions using the four detection electrodes. In addition, the accuracy in detecting the touch positions can be improved by improving the linearity of the correlation between the output of the sensor and the touch position.

What is claimed is:

1. An electrostatic capacity type touch sensor, comprising:
   a substrate;
   a first common electric potential line disposed on the substrate;
   a second common electric potential line disposed on the substrate, the second common electric potential line surrounding the first common electric potential line;
   first and second detection electrodes disposed on the substrate in a region interposed between the first and second common electric potential lines and being axisymmetrical with respect to a Y axis, the Y axis intersecting a common center of the first and second common electric potential lines;
   third and fourth detection electrodes disposed on the substrate in the region and being axisymmetrical with respect to an X axis, the X axis intersecting the common center and being orthogonal to the Y axis;
   a charge amplifier generating a first output voltage and a second output voltage, the first output voltage being proportional to a capacitance difference between a capacitance of a first capacitor formed between the first detection electrode and the first and second common electric potential lines and a capacitance of a second capacitor formed between the second detection electrode and the first and second common electric potential lines, the second output voltage being proportional to a capacitance difference between a capacitance of a third capacitor formed between the third detection electrode and the first and second common electric potential lines and a capacitance of a fourth capacitor formed between the fourth detection electrode and the first and second common electric potential lines;
   first to fourth terminals electrically connected to the first to fourth detection electrodes, respectively, for applying the charge amplifier with voltages corresponding respectively to the capacitance of the first capacitor, the capacitance of the second capacitor, the capacitance of the third capacitor, and the capacitance of the fourth capacitor, the first to fourth terminals being included a first wiring layer; and
   a common electric potential line electrically connecting the first common electric potential line and the second common electric potential line, the common electric potential line being included in a second wiring layer different from the first wiring layer, the common electric potential line electrically isolated from and overlapping the first detection electrode in a plan view of the electrostatic capacity type touch sensor.

2. The electrostatic capacity type touch sensor of claim 1, wherein the first common electric potential line is disposed on a circumference of a first circle with a first radius, and the second common electric potential line is disposed on a circumference of a second circle with a second radius, the second radius being larger than the first radius, and wherein a boundary region between the first detection electrode and the third detection electrode is set so that an area of the first detection electrode included in a sector form of the second circle and an area of the third detection electrode included in the sector form vary linearly as the sector form rotates.

3. The electrostatic capacity type touch sensor of claim 2, wherein the boundary region between the first detection electrode and the third detection electrode is set so that the area of the first detection electrode included in the sector form linearly decreases and the area of the third detection electrode included in the sector form linearly increases as the sector form rotates.

4. The electrostatic capacity type touch sensor of claim 2, wherein X and Y coordinates of a point on a center line of the boundary region in a first quadrant of an X-Y coordinate system are represented by following equations:

$$X=(R+W\times n/90°)\times\cos(\pi\times n/180°)$$

$$Y=(R+W)\times n/90°\times\sin(\pi\times n/180°)$$

where R denotes the first radius, R+W denotes the second radius, and n varies from 0° to 90°.

5. The electrostatic capacity type touch sensor of claim 1, further comprising an arithmetic unit detecting a touch position on the region interposed between the first and second common electric potential lines based on calculation of $\tan^{-1}$ (V1/V2), where V1 denotes the first output voltage and V2 denotes the second output voltage.

6. The electrostatic capacity type touch sensor of claim 1, wherein the first common electric potential line is disposed on a circumference of a first ellipse and the second common electric potential line is disposed on a circumference of a second ellipse, the second ellipse being larger than the first ellipse.

7. An electrostatic capacity type touch sensor, comprising:
a substrate;
a first common electric potential line disposed on the substrate;
a second common electric potential line disposed on the substrate adjacent the first common electric potential line;
first, second, third and fourth detection electrodes disposed on the substrate in a region interposed between the first common electric potential line and the second common electric potential line;
a charge amplifier generating a first output voltage and a second output voltage, the first output voltage being proportional to a capacitance difference between a capacitance of a first capacitor formed between the first detection electrode and the first and second common electric potential lines and a capacitance of a second capacitor formed between the second detection electrode and the first and second common electric potential lines, the second output voltage being proportional to a capacitance difference between a capacitance of a third capacitor formed between the third detection electrode and the first and second common electric potential lines and a capacitance of a fourth capacitor formed between the fourth detection electrode and the first and second common electric potential lines;
first to fourth terminals electrically connected to the first to fourth detection electrodes, respectively, for applying the charge amplifier with voltages corresponding respectively to the capacitance of the first capacitor, the capacitance of the second capacitor, the capacitance of the third capacitor, and the capacitance of the fourth capacitor, the first to fourth terminals being included a first wiring layer; and
a common electric potential line electrically connecting the first common electric potential line and the second common electric potential line, the common electric potential line being included in a second wiring layer different from the first wiring layer, the common electric potential line electrically isolated from and overlapping the first detection electrode in a plan view of the electrostatic capacity type touch sensor,
wherein the first common electric potential line is disposed on a circumference of a first arc with a first radius and the second common electric potential line is disposed on a circumference of a second arc with a second radius, the first and second arcs sharing a common center and the second radius being larger than the first radius, and wherein a boundary region between the first detection electrode and the third detection electrode is set so that an area of the first detection electrode included in a sector form of the second arc having a predetermined center angle decreases as the sector form rotates and an area of the third detection electrode included in the sector form increases as the sector form rotates.

* * * * *